United States Patent
McIntyre et al.

(10) Patent No.: US 12,166,098 B2
(45) Date of Patent: Dec. 10, 2024

(54) CERIUM-DOPED FERROELECTRIC MATERIALS AND RELATED DEVICES AND METHODS

(71) Applicant: The Board of Trustees of the Leland Stanford Junior University, Stanford, CA (US)

(72) Inventors: Paul C. McIntyre, Sunnyvale, CA (US); Wilman Tsai, Saratoga, CA (US); John D. Baniecki, Palo Alto, CA (US); Zhouchangwan Yu, Stanford, CA (US); Balreen Saini, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 405 days.

(21) Appl. No.: 17/533,336

(22) Filed: Nov. 23, 2021

(65) Prior Publication Data

US 2023/0163190 A1     May 25, 2023

(51) Int. Cl.
| | |
|---|---|
| *H01L 21/00* | (2006.01) |
| *H01L 21/02* | (2006.01) |
| *H01L 29/51* | (2006.01) |
| *H01L 29/78* | (2006.01) |
| *H01L 49/02* | (2006.01) |

(52) U.S. Cl.
CPC ...... *H01L 29/516* (2013.01); *H01L 21/02194* (2013.01); *H01L 21/0228* (2013.01); *H01L 28/60* (2013.01); *H01L 29/78391* (2014.09)

(58) Field of Classification Search
CPC .......... H01L 29/516; H01L 29/78391; H01L 21/02194; H01L 21/0228; H01L 28/60; H10B 51/00
See application file for complete search history.

(56) References Cited

PUBLICATIONS

Xiao et al., "Improvement of Ferroelectricity in Ce-Doped Hf0.5Zr0.5O2 Thin Films", Coatings 2022, 12, 1766.*
Yu et al., "CeO2-Doped Hf0.5Zr0.5O2 Ferroelectrics for High Endurance Embedded Memory Applications", 2022 International Symposium on VLSI Technology, Systems and Applciations.*
(Continued)

*Primary Examiner* — Richard A Booth
(74) *Attorney, Agent, or Firm* — Withrow & Terranova, P.L.L.C.

(57) ABSTRACT

Ferroelectric materials and more particularly cerium-doped ferroelectric materials and related devices and methods are disclosed. Aspects of the present disclosure relate to ferroelectric layers of hafnium-zirconium-oxide (HZO) doped with cerium that enable reliable ferroelectric fabrication processes and related structures with significantly improved cycling endurance performance. Such doping in ferroelectric layers also provides the capability to modulate polarization to achieve a desired operation voltage range. Doping concentrations of cerium in HZO films are disclosed with ranges that provide a stabilized polar orthorhombic phase in resulting films, thereby promoting ferroelectric capabilities. Exemplary fabrication techniques for doping cerium in HZO films as well as exemplary device structures including metal-ferroelectric-metal (MFM) and metal-ferroelectric-insulator-semiconductor (MFIS) structures are also disclosed.

16 Claims, 11 Drawing Sheets

(56) References Cited

PUBLICATIONS

Andrievskaya, E.R. et al., "Phase Equilibrium in the System HfO2—ZrO2—CeO2 at 1500° C.," Powder Metallurgy and Metal Ceramics, vol. 45, Nos. 9-10, Sep. 2006, Springer Science+Business Media, Inc., 9 pages.
Chang, S.C. et al., "Anti-ferroelectric HfxZr1—xO2 Capacitors for High-density 3-D Embedded-DRAM," 2020 IEEE International Electron Devices Meeting (IEDM), Dec. 12-18, 2020, San Francisco, CA, IEEE, 4 pages.
Chang, S.W. et al., "SILC Degradation Model to Predict Area Scaling for Gate Dielectric Breakdown in Advanced Technologies," 2017 IEEE International Reliability Physics Symposium (IRPS), Apr. 2-6, 2017, Monterey, CA, USA, IEEE, 5 pages.
Chernikova, A.G. et al., "Improved Ferroelectric Switching Endurance of La-Doped Hf0.5Zr0.5O2 Thin Films," ACS Applied Materials & Interfaces, vol. 10, No. 3, Jan. 2018, American Chemical Society, pp. 2701-2708.
Dutta, S. et al., "Monolithic 3D Integration of High Endurance Multi-Bit Ferroelectric FET for Accelerating Compute-in-Memory," 2020 IEEE International Electron Devices Meeting (IEDM), Dec. 12-18, 2020, San Francisco, CA, IEEE, 4 pages.
Francois, T. et al., "Demonstration of BEOL-compatible ferroelectric Hf0.5Zr0.5O2 scaled FeRAM co-integrated with 130nm CMOS for embedded NVM applications," 2019 IEEE International Electron Devices Meeting (IEDM), Dec. 7-11, 2019, IEEE, San Francisco, CA, USA, 4 pages.
Hur, J. et al., "A Technology Path for Scaling Embedded FeRAM to 28nm with 2T1C Structure," 2021 IEEE International Memory Workshop (IMW), May 16-19, 2021, Dresden, Germany, IEEE, 4 pages.
Khan, A. et al., "The future of ferroelectric field-effect transistor technology," Nature Electronics, vol. 3, Oct. 2020, pp. 588-597.
Midgley, P. et al., "Precession electron diffraction—a topical review," IUCrJ, vol. 2, Jan. 2015, pp. 126-136.
Okuno, J. et al., "SoC Compatible 1T1C FeRAM Memory Array Based on Ferroelectric Hf0.5Zr0.5O2," 2020 IEEE Symposium on VLSI Technology, Jun. 16-19, 2020, Honolulu, HI, USA, IEEE, 2 pages.
Park, M.H. et al., "Evolution of phases and ferroelectric properties of thin Hf0.5Zr0.5O2 films according to the thickness and annealing temperature," Applied Physics Letters, vol. 102, Jun. 2013, AIP Publishing LLC, 6 pages.
Rauch, E. et al., "ACOM/TEM (ASTAR) : Automated crystal orientation mapping with TEMs," Webinar, NanoMEGAS, 2020, https://nanomegas.com/webinars/webinar2020-2/, 2 pages.
Shiraishi, T. et al., "Formation of the orthorhombic phase in CeO2—HfO2 solid solution epitaxial thin films and their ferroelectric properties," Applied Physics Letters, vol. 114, Jun. 2019, AIP Publishing, 6 pages.
Skorodumova, N.V. et al., "Electronic, bonding, and optical properties of CeO2 and Ce2O3 from first principles," Physical Review B, vol. 64, 115108, Aug. 2001, The American Physical Society, 9 pages.
Wuilloud, E. et al., "Spectroscopic Evidence for Localized and Extended f-Symmetry States in Ce02," Physical Review Letters, vol. 53, No. 2, Jul. 1984, The American Physical Society, 4 pages.

* cited by examiner

CERIUM-DOPED FERROELECTRIC MATERIALS AND RELATED DEVICES AND METHODS

FIELD OF THE DISCLOSURE

The present disclosure relates to ferroelectric materials and more particularly to cerium-doped ferroelectric materials and related devices and methods.

BACKGROUND

Ferroelectric materials are promising for use in a variety of semiconductor device applications, including memory applications such as ferroelectric random-access memory (FeRAM) devices and ferroelectric field-effect-transistor (FeFET) devices. This is in part due to the ability of ferroelectric materials to scale down to ultra-thin films for use in devices with small dimensions. Additionally, ferroelectric materials are compatible with back-end-of-line (BEOL) process temperatures. One such ferroelectric material of interest is hafnium-zirconium-oxide (HZO). While providing scalability for decreased device sizes and BEOL compatibility, challenges exist for widespread adoption of HZO materials in semiconductor applications. For example, limited cycling endurance is a major challenge for implementation of HZO in commercial products developed for embedded memories. High cycle endurance is an essential characteristic for memory devices utilized in modern memory architectures featuring high throughput and energy efficiency, such as near-memory or in-memory computing architectures where memory is integrated with logic on a same chip. Anti-ferroelectric (AFE) HZO and ferroelectric Lanthanum (La)-doped HZO have been demonstrated to enhance the endurance in metal-ferroelectric-metal (MFM) capacitors. However, reliability of metal-ferroelectric-insulator-semiconductor (MFIS) gate stacks for FeFETs remains challenging, where dielectric interfacial layers can exhibit early failure due to the high electric-field development during polarization switching.

As advancements in modern semiconductor technology progress, the art continues to seek improved ferroelectric materials having desirable characteristics capable of overcoming challenges associated with conventional materials and related semiconductor devices.

SUMMARY

The present disclosure relates to ferroelectric materials and more particularly to cerium-doped ferroelectric materials and related devices and methods. Aspects of the present disclosure relate to ferroelectric layers of hafnium-zirconium-oxide (HZO) doped with cerium that enable reliable ferroelectric fabrication processes and related structures with significantly improved cycling endurance performance. Such doping in ferroelectric layers also provides the capability to modulate polarization to achieve a desired operation voltage range. Doping concentrations of cerium in HZO films are disclosed with ranges that provide a stabilized polar orthorhombic phase in resulting films, thereby promoting ferroelectric capabilities. Exemplary fabrication techniques for doping cerium in HZO films as well as exemplary device structures including metal-ferroelectric-metal (MFM) and metal-ferroelectric-insulator-semiconductor (MFIS) structures are also disclosed.

In one aspect, a device comprises: a substrate; and a ferroelectric layer of $Hf_xZr_{1-x}O_2$ ($0 \leq x < 1$) on the substrate, wherein the layer of $Hf_xZr_{1-x}O_2$ is doped with a cerium dopant. In certain embodiments, the cerium dopant comprises $CeO_2$ such that the ferroelectric layer of $Hf_xZr_{1-x}O_2$ is a $CeO_2$-doped $Hf_xZr_{1-x}O_2$ layer. In certain embodiments, a cation concentration ratio of cerium to cerium and hafnium and zirconium (Ce/(Ce+Hf+Zr)) in the $CeO_2$-doped $Hf_xZr_{1-x}O_2$ layer is in a range from 1% to 10%. In certain embodiments, a cation concentration ratio of cerium to cerium and hafnium and zirconium (Ce/(Ce+Hf+Zr)) in the $CeO_2$-doped $Hf_xZr_{1-x}O_2$ layer is in a range from 2% to 5.6%. In certain embodiments, a thickness of the $CeO_2$-doped $Hf_xZr_{1-x}O_2$ layer is in a range from 1 nm to 50 nm. In certain embodiments, the $CeO_2$-doped $Hf_xZr_{1-x}O_2$ layer is arranged between a first metal layer and a second metal layer to form a metal-ferroelectric-metal (MFM) capacitor structure. In certain embodiments, the $CeO_2$-doped $Hf_xZr_{1-x}O_2$ layer in the MFM capacitor structure is configured to be switchable after $10^{10}$ cycles of up to ±3 V with a pulse width of up to 500 ns. In certain embodiments, the $CeO_2$-doped $Hf_xZr_{1-x}O_2$ layer in the MFM capacitor structure is configured to be switchable after $10^{11}$ cycles of up to ±3 V with a pulse width of up to 100 ns. In certain embodiments, a switchable polarization ($P_{SW}$) of the $CeO_2$-doped $Hf_xZr_{1-x}O_2$ layer is in a range from 5 $\mu C/cm^2$ to 50 $\mu C/cm^2$ after the $10^8$ cycles. In certain embodiments, the $CeO_2$-doped $Hf_xZr_{1-x}O_2$ layer is arranged as a portion of a gate structure in a ferroelectric field-effect transistor (FeFET) device. In certain embodiments, the gate structure forms a metal-ferroelectric-insulator-semiconductor structure.

In another aspect, a method comprises: providing a substrate; and depositing a cerium-doped ferroelectric layer by atomic layer deposition where precursors of the cerium-doped ferroelectric material are sequentially formed on the substrate to form the cerium-doped ferroelectric layer. In certain embodiments, the precursors of the cerium-doped ferroelectric material are sequentially formed on the substrate in the presence of an oxygen plasma. In certain embodiments, the cerium-doped ferroelectric layer comprises cerium-doped $Hf_xZr_{1-x}O_2$ ($0 \leq x < 1$). In certain embodiments, the cerium-doped ferroelectric layer incorporates a dopant of $CeO_2$. In certain embodiments, the precursors for the atomic layer deposition comprise hafnium precursors, zirconium precursors, and cerium precursors, and the atomic layer deposition comprises a plurality of super cycles such that each super cycle of the plurality of super cycles comprises: at least one pulse of the hafnium precursor; at least one pulse of the zirconium precursor; and a plurality of pulses of the cerium precursor.

In another aspect, a method comprises: providing a substrate; and depositing a ferroelectric layer of $Hf_xZr_{1-x}O_2$ ($0 \leq x < 1$) on the substrate, wherein the ferroelectric layer of $Hf_xZr_{1-x}O_2$ is doped with a cerium dopant. In certain embodiments, the ferroelectric layer of $Hf_xZr_{1-x}O_2$ that is doped with a cerium dopant is deposited by at least one of sputtering, molecular-beam epitaxy (MBE), electron-beam evaporation, electron-beam physical vapor deposition (PVD), sputtering PVD, chemical vapor deposition (CVD), pulsed laser deposition (PLD), and chemical solution deposition (CSD). In certain embodiments, the cerium dopant comprises $CeO_2$ such that the ferroelectric layer of $Hf_xZr_{1-x}O_2$ is a $CeO_2$-doped $Hf_xZr_{1-x}O_2$ layer. In certain embodiments, a cation concentration ratio of cerium to cerium and hafnium and zirconium (Ce/(Ce+Hf+Zr)) in the $CeO_2$-doped $Hf_xZr_{1-x}O_2$ layer is in a range from 1% to 10%.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 6:
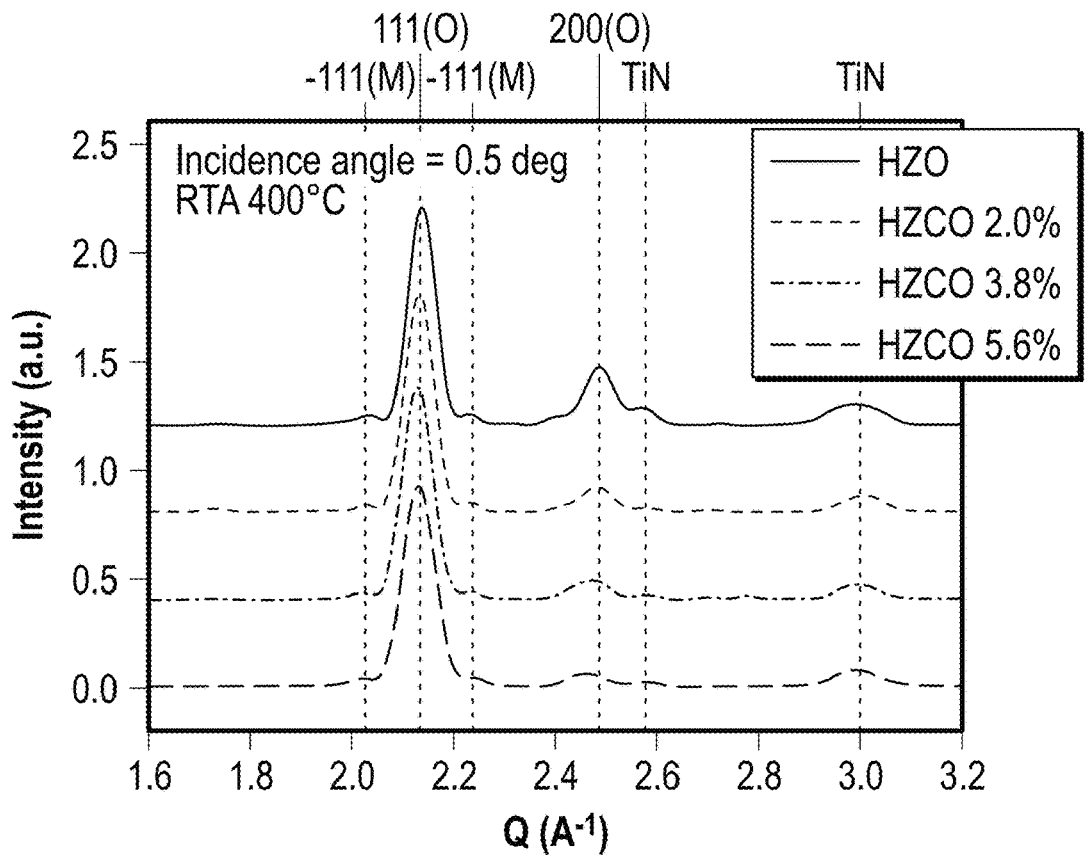

FIG. 6. is a plot depicting grazing incident x-ray diffraction (Gi-XRD) characterization of HZO films with and without cerium doping and crystalized at 400° C.

Figure 7A:
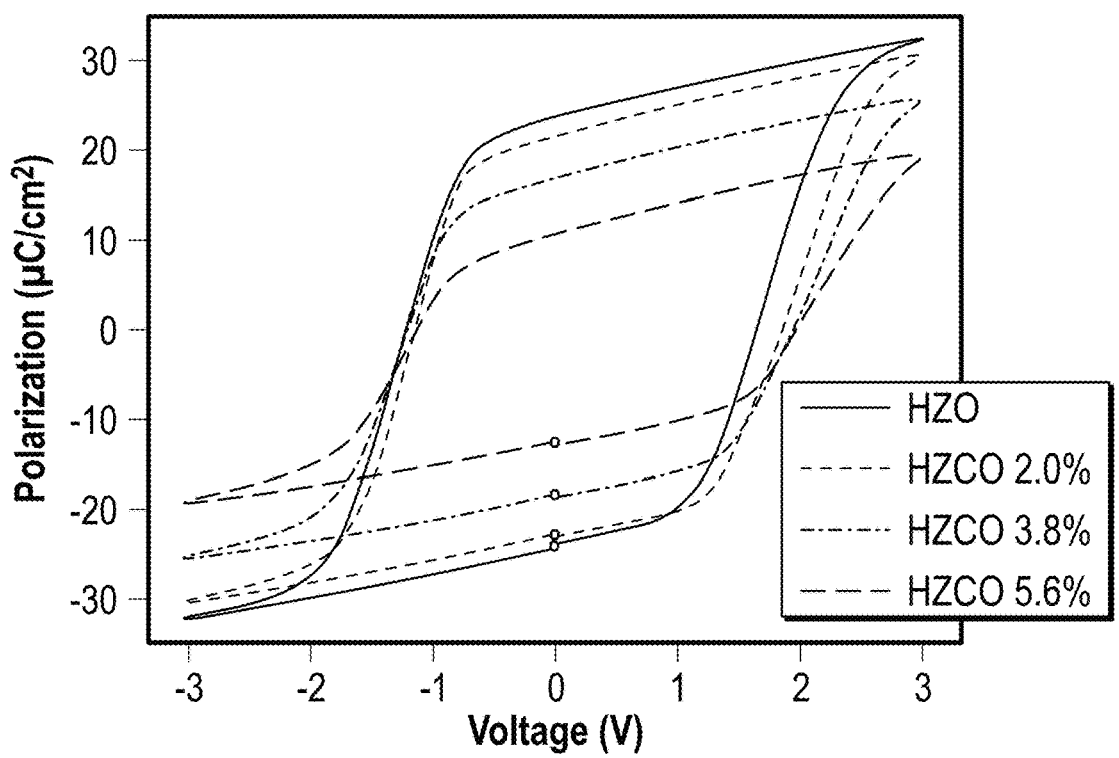

FIG. 7A depicts polarization-voltage (P-V) hysteresis of HZO films with and without cerium doping in MFM capacitor structures and annealed at 400° C. in a nitrogen ($N_2$) ambient.

Figure 7B:
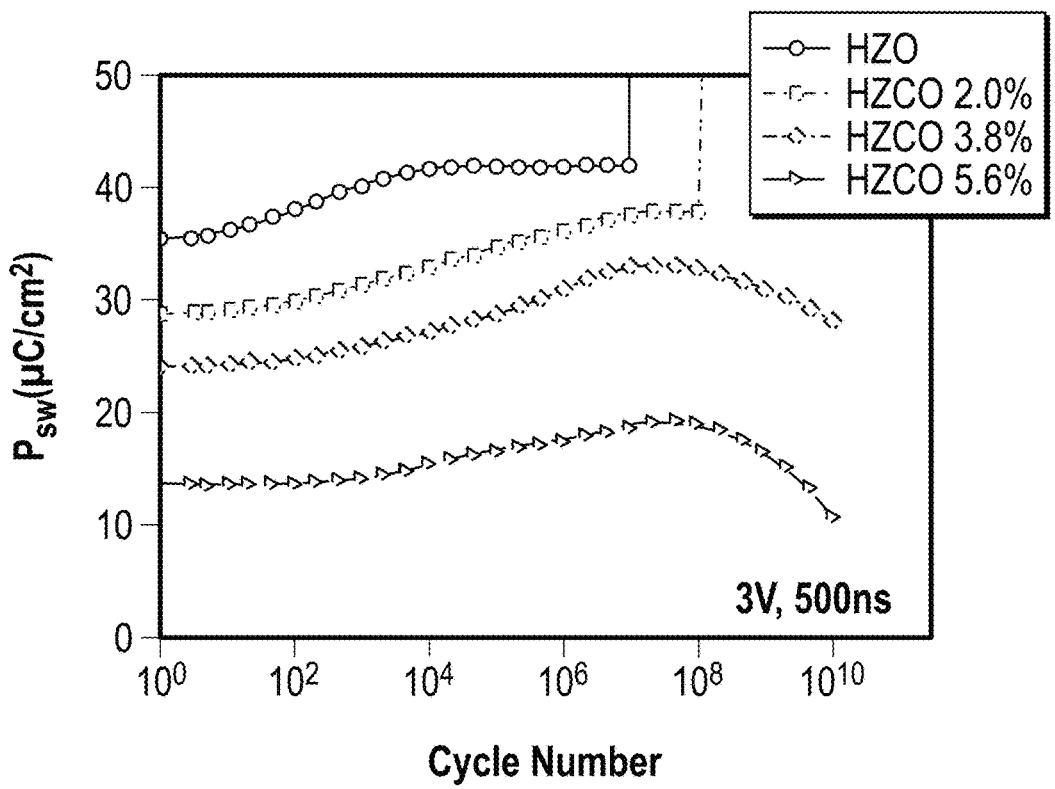

FIG. 7B is a plot representing endurance of the HZO and HZCO films in the MFM structures of FIG. 7A under various cycling conditions.

Figure 7C:
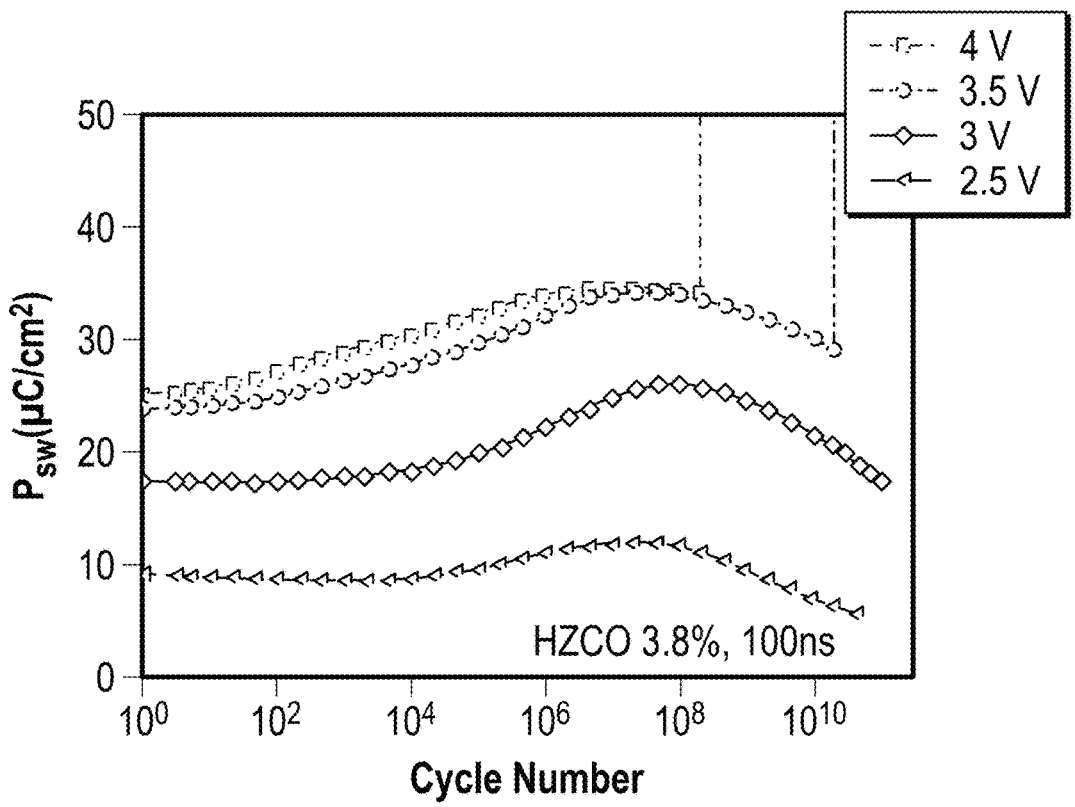

FIG. 7C is a plot representing endurance of certain HZCO films with shorter cycling pulses at various voltages.

Figure 8A:
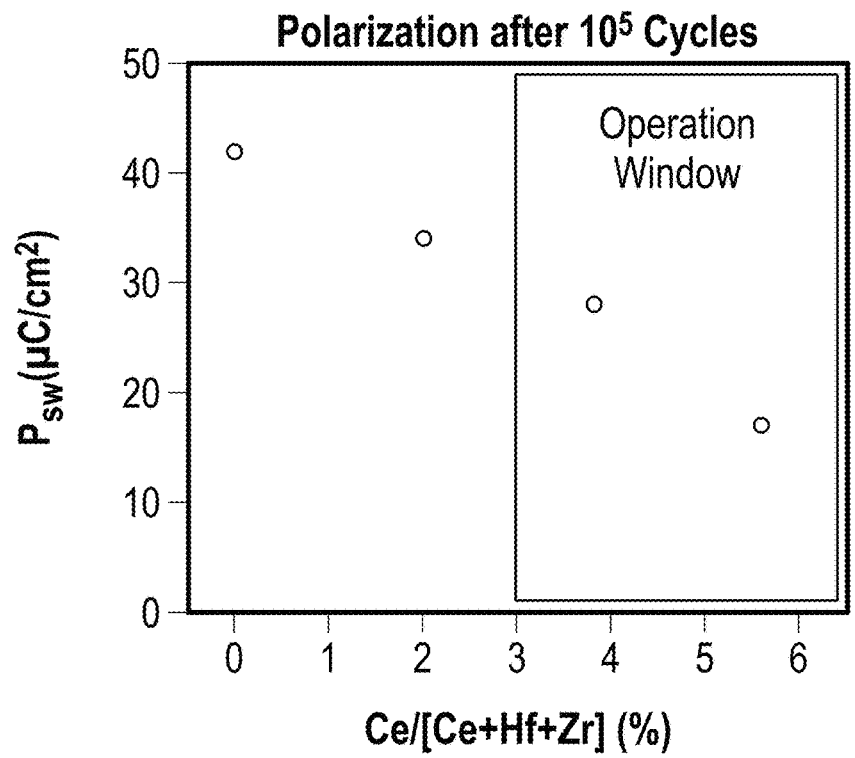

FIG. 8A is a plot representing switchable polarization after $10^5$ cycles by cerium doping percentage for the data provided for the MFM structures of FIG. 7B.

Figure 8B:
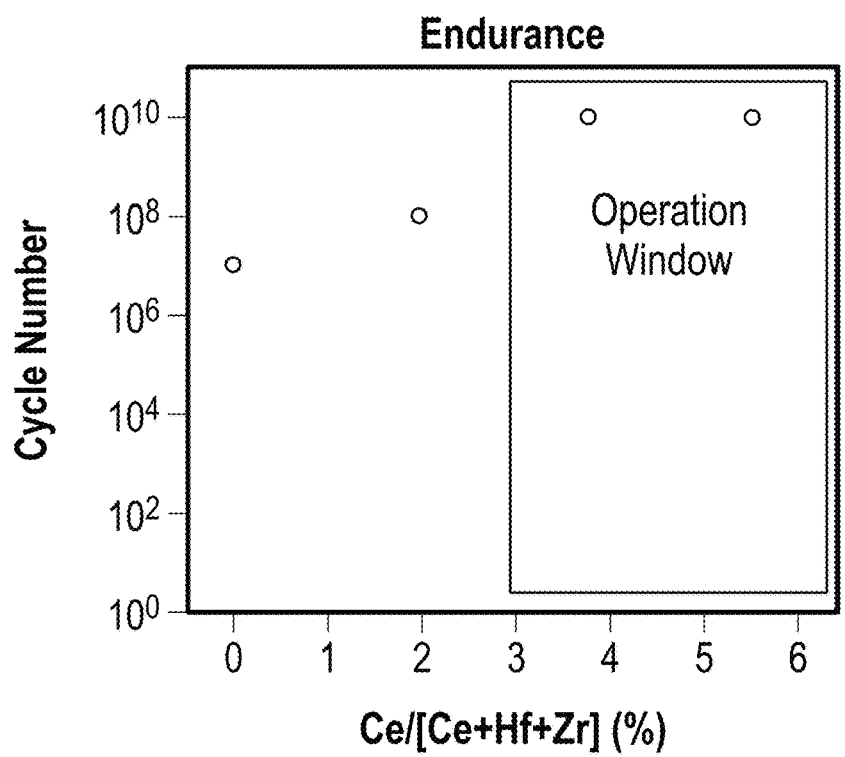

FIG. 8B is a plot representing endurance in cycle number versus cerium doping percentage for the data provided for the MFM structures of FIG. 7B.

Figure 9:
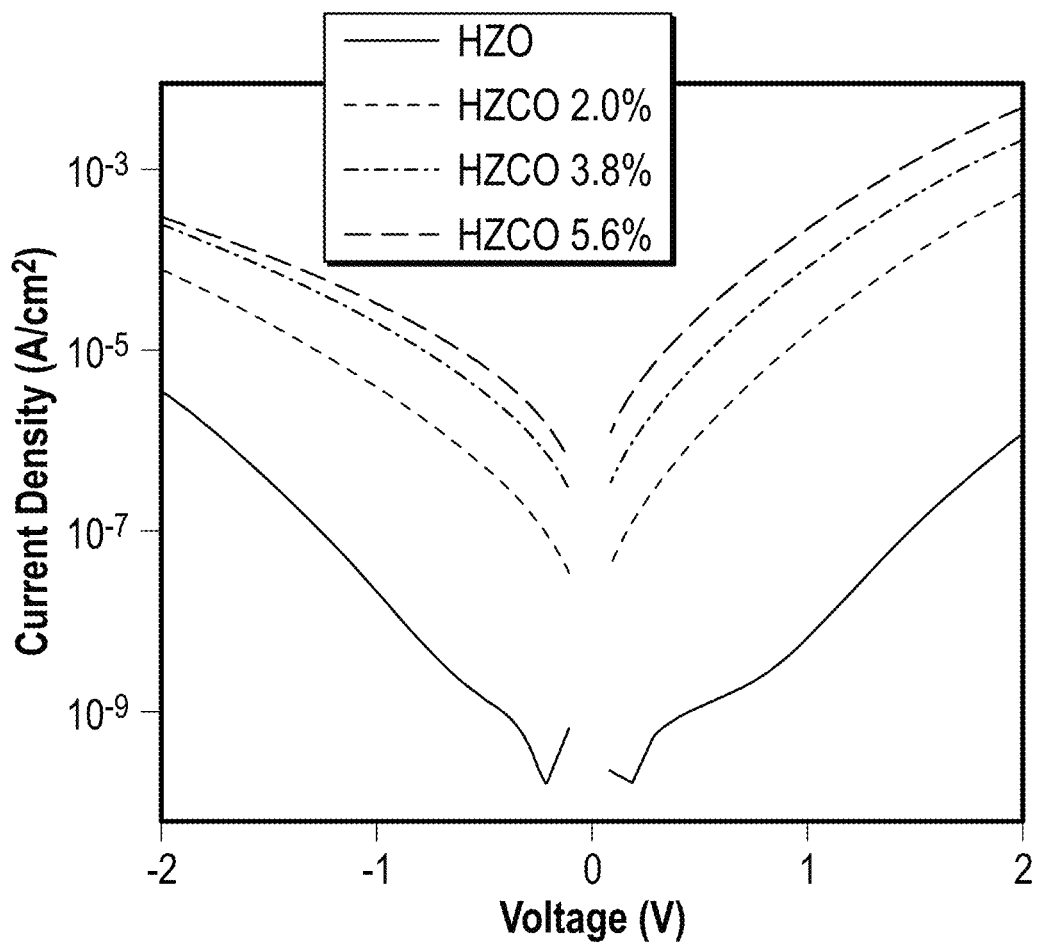

FIG. 9 is a plot representing the effect of cerium doping in HZCO films on leakage current.

Figure 3:
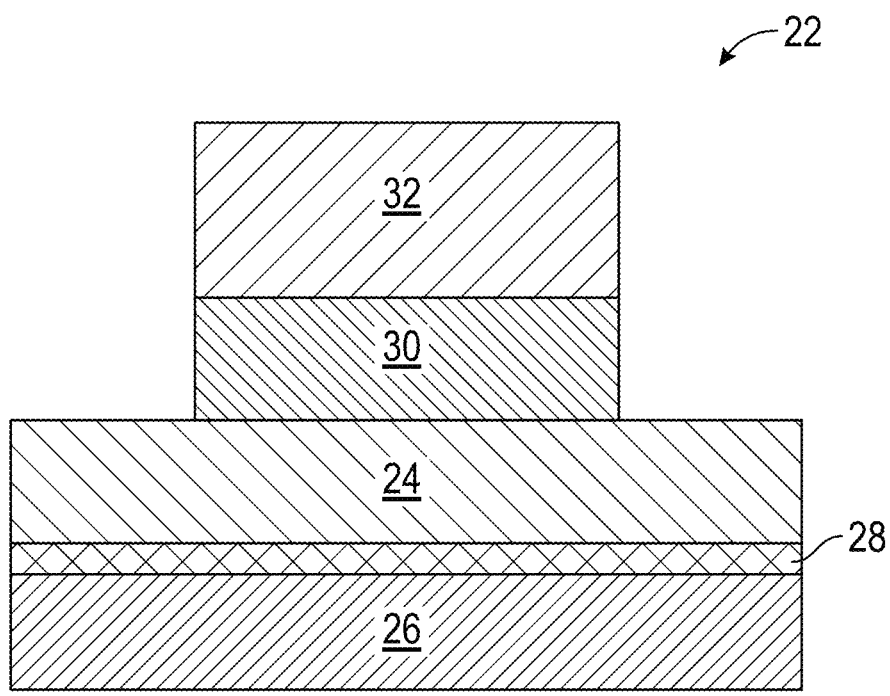
FIG. 3 is a cross-sectional view of an exemplary metal-ferroelectric-insulator-semiconductor (MFIS) structure that includes an HZCO layer according to principles of the present disclosure.
Figure 10A:
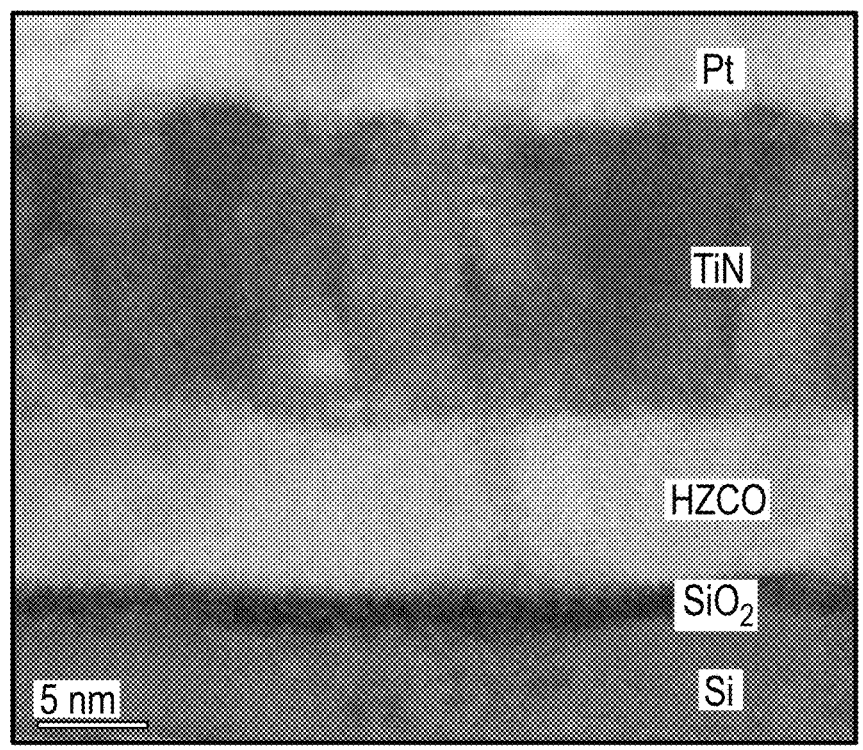

FIG. 10A is a cross-sectional STEM image taken with LAADF imaging mode for an MFIS structure arranged in a similar manner to the MFIS structure of FIG. 3 with an HZCO film.

Figure 10B:
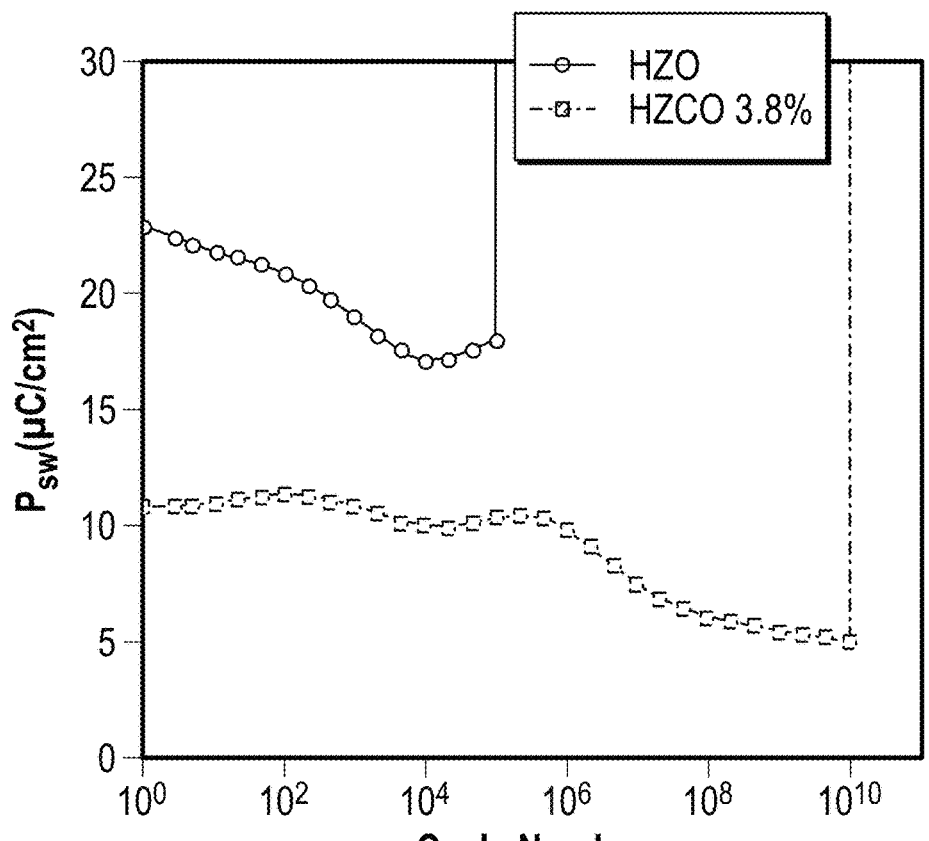

FIG. 10B is a plot representing endurance of HZO and HZCO films in MFIS structures under various cycling conditions.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to ferroelectric materials and more particularly to cerium-doped ferroelectric materials and related devices and methods. Aspects of the present disclosure relate to ferroelectric layers of hafnium-zirconium-oxide (HZO) doped with cerium that enable reliable ferroelectric fabrication processes and related structures with significantly improved cycling endurance performance. Such doping in ferroelectric layers also provides the capability to modulate polarization to achieve a desired operation voltage range. Doping concentrations of cerium in HZO films are disclosed with ranges that provide a stabilized polar orthorhombic phase in resulting films, thereby promoting ferroelectric capabilities. Exemplary fabrication techniques for doping cerium in HZO films as well as exemplary device structures including metal-ferroelectric-metal (MFM) and metal-ferroelectric-insulator-semiconductor (MFIS) structures are also disclosed.

HZO is a ferroelectric material of interest for use in various semiconductor device applications, including embedded memory devices such as ferroelectric field-effect-transistor (FeFET) devices, ferroelectric random-access memory (FeRAM) devices, and other embedded memory devices, among others. HZO may include alloys of hafnium dioxide ($HfO_2$) and zirconium dioxide ($ZrO_2$). Widespread adoption of HZO in semiconductor applications, such as embedded memory, is challenging due to limited cycling endurance and low voltage operation such as less than about 1.5 volts (V). Aspects of the present disclosure relate to HZO that is doped with cerium (Ce) that enables reliable ferroelectric fabrication processes with significantly improved cycling endurance performance and the capability to modulate polarization to achieve a desired operation voltage range. In certain embodiments, cerium dopants for HZO range may include cerium dioxide ($CeO_2$), among other cerium dopant sources, to provide $CeO_2$-doped HZO. As used herein, $CeO_2$-doped HZO may also be referred to as HZCO. HZCO may also be referred to as cerium-doped $Hf_xZr_{1-x}O_2$ ($0 \leq x < 1$). According to aspects of the present disclosure, Ce cation ratios for HZCO films may be provided in a range from 1% to 10%, or in a subrange from 2% to 7%, or in a subrange from 2% to 5.6%, depending on the particular embodiment and/or the desired polarization characteristics. Exemplary thicknesses for HZCO films or layers according to the present disclosure may be provided in a range from 1 nanometer (nm) to 50 nm, although subranges such as 5 nm to 15 nm, or 5 nm to 10 nm, or other ranges with thicker values may also be provided.

Aspects of the present disclosure relate to HZCO films where the polar orthorhombic-(O) phase is the dominant phase, thereby promoting ferroelectric capabilities in the HZCO films. In HZCO solid solutions, non-ferroelectric tetragonal-(T) and monoclinic-(M) phases co-exist at high temperatures, such as about 1500 degrees Celsius (° C.). The metastable ferroelectric O-phase, which may be seen as a distortion of the T-phase, may form at low temperatures in thin films, as a result of competition between T-phases and M-phases. According to principles of the present disclosure, HZCO films that exhibit ferroelectricity are disclosed along with related devices and methods. For example, high polarization and reliable switching characteristics for HZO films may be achieved beyond $10^{11}$ cycles in MFM capacitors. In another example, high endurance, such as greater than $10^{10}$ cycles, is also demonstrated in MFIS gate stacks for FeFET devices. Cycling behaviors are systematically studied with stress-induced leakage current, suggesting $CeO_2$ doping in HZCO films delays the degradation caused by thermal runaway. Mechanisms responsible for the observed $CeO_2$ doping effects are probed using photoconductivity (PC) and internal photoemission (IPE) measurements, indicating possible conduction through in-gap states in HZCO films.

Figure 1A:
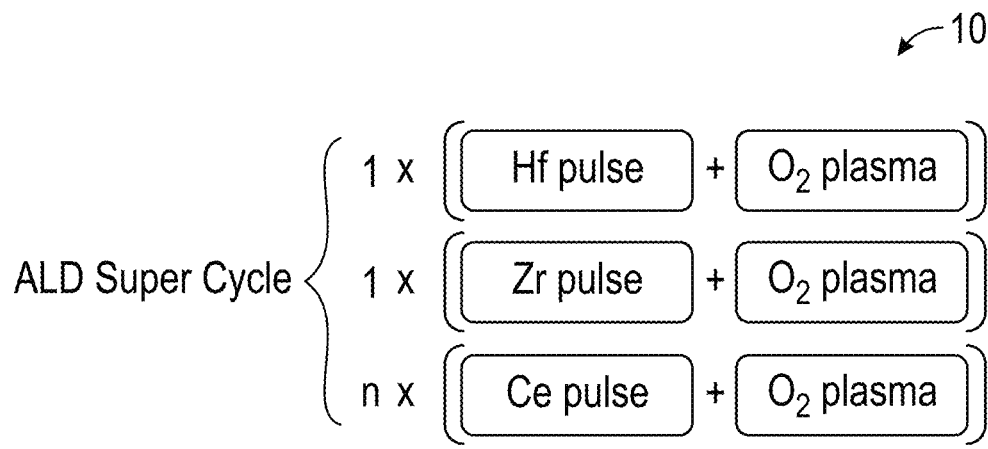
FIG. 1A is a schematic view of a generalized process flow for the fabrication of cerium-doped hafnium-zirconium-oxide (HZCO) films with plasma-enhanced atomic-layer-deposition (PE-ALD) according to principles of the present disclosure.

FIG. 1A is a schematic view of a generalized process flow 10 for the fabrication of HZCO films according to principles of the present disclosure. In certain embodiments, HZCO films may be fabricated by way of an atomic layer deposition (ALD) process. In certain embodiments, the ALD process may embody a plasma-enhanced ALD (PE-ALD) process. As illustrated in FIG. 1A, the HZCO film may be deposited by PE-ALD with a number of sequential ALD super cycles. Each super cycle may include intermittent and/or sequential pulse of Hf, $Zr_{1-x}$, and Ce precursors, each of which include oxygen or $O_2$ plasma as the co-reactant. In certain embodiments, each ALD super cycle includes a single Hf pulse for $HfO_2$ and a single Zr pulse for $ZrO_2$ with a number (n) of Ce pulses to control $CeO_2$ incorporation. In this regard, the Ce doping content in the resulting HZCO film may be controlled by varying the number (n) of $CeO_2$ pulse or cycles within each ALD super cycle. In certain embodiments, the number (n) of $CeO_2$ pulse or cycles may be in a range from 1 to 10, or in a range from 1 to 7, or in a range from 1 to 4, depending on the targeted composition. While FIG. 1A is illustrated with a single Hf pulse and a single Zr pulse, certain embodiments may also have multiple pulses of Hf and/or Zr. Ce doping content, concentration, or percentage may be represented herein as a Ce cation ratio or fraction of Ce/(Hf+Zr+Ce) for a HZCO film. While PE-ALD is described in the context of FIG. 1A and in other examples provided below, the principles of the present disclosure for HZCO films may include other fabrication techniques, including but not limited to electron-beam physical vapor deposition (PVD) or electron-beam evaporation, molecular-beam epitaxy (MBE), sputtering PVD, chemical vapor deposition (CVD), pulsed laser deposition (PLD), and chemical solution deposition (CSD). Additionally, the principles described above are applicable to provide cerium doping in various ferroelectric materials, such as $ZrO_2$, $HfO_2$, silicon (Si)-doped $HfO_2$, lanthanum (La)-doped $HfO_2$, and yttrium (Y)-doped $HfO_2$.

Figure 1B:
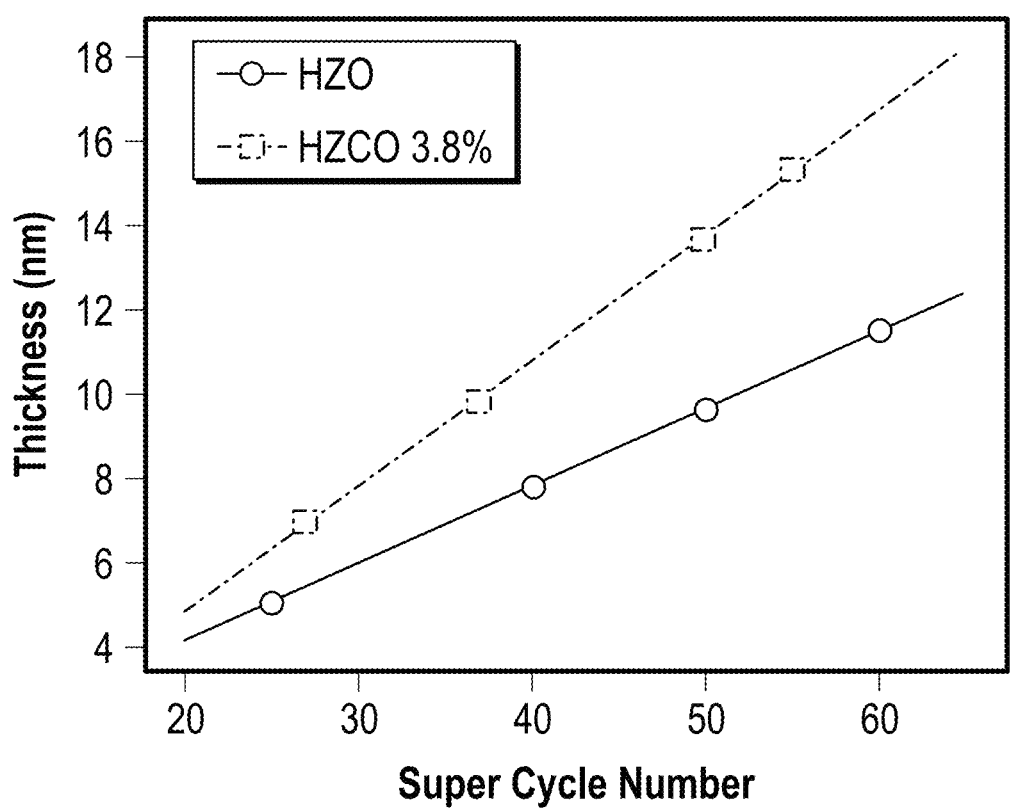
FIG. 1B is a chart plotting film thickness by number of ALD super cycles for HZCO films deposited according to FIG. 1A and for hafnium-zirconium-oxide (HZO) films deposited by the same PE-ALD process without cerium dopants.

FIG. 1B is a chart plotting film thickness by number of ALD super cycles for HZCO films deposited according to FIG. 1A and for HZO films deposited by the same PE-ALD process without cerium dopants. For the purposes of this experiment, the HZCO films were deposited with controlled Ce pulses within each ALD super cycle according to FIG. 1A to achieve $CeO_2$ doping of about 3.8% within the HZCO films. The ALD super cycle numbers were selected at various values between 20 and 60 with resulting film thicknesses within a range from 6 nm to 16 nm for the HZCO films. For the HZO films, the deposition process according to FIG. 1A was followed, except the step of Ce pulses within each ALD super cycle was omitted. As illustrated, both the HZCO and HZO films exhibit linear relationships between ALD super cycle numbers and film thicknesses. In this regard, the HZCO deposition process according to FIG. 1A may exhibit atomically controlled deposition.

Figure 2:
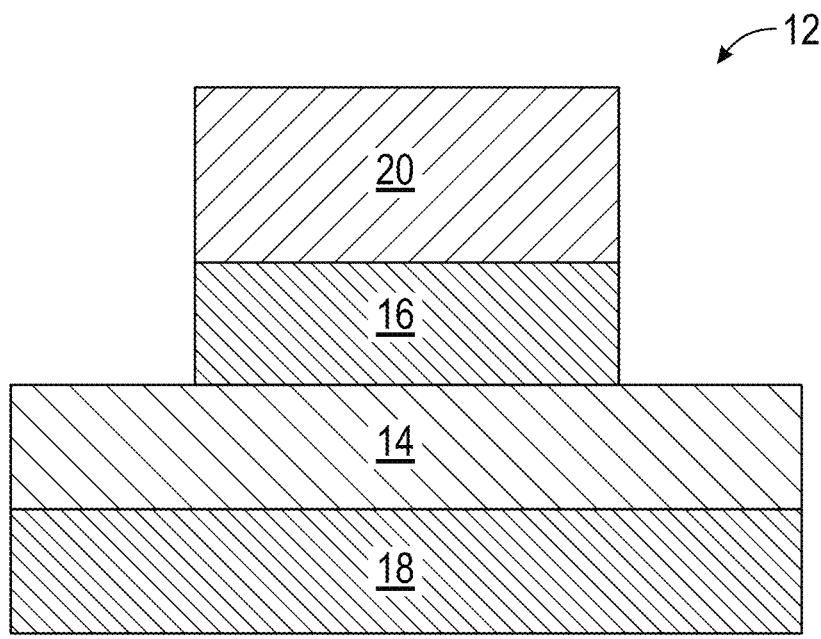
FIG. 2 is a cross-sectional view of an exemplary metal-ferroelectric-metal (MFM) capacitor that includes an HZCO layer according to principles of the present disclosure.

FIG. 2 is a cross-sectional view of an exemplary MFM capacitor 12 that includes an HZCO layer 14 according to principles of the present disclosure. As illustrated, the HZCO layer 14 is arranged between a top electrode 16 or top metal layer and a bottom electrode 18 or bottom metal layer. A top contact 20 is provided on the top electrode 16 in an arrangement for receiving external electrical connections for the MFM capacitor 12. For the purposes of later-described comparison measurements, multiple ones of the MFM capacitor 12 were fabricated. For each MFM capacitor 12, the top and bottom electrodes 16, 18 comprise titanium nitride (TiN) formed by a sputtering process to provide a thickness of about 10 nm. The HZCO layer 14 was deposited according to FIG. 1A to provide a film thickness of about 9 nm. A post-metal rapid thermal anneal (RTA) was performed at 350-400° C. after the formation of the top electrode 16. The top contact 20 may comprise a platinum (Pt) or a titanium-platinum material that is then deposited by electron-beam evaporation and patterned by photolithography. The top electrode 16 is selectively wet etched by a solution of $H_2O_2$, $NH_4OH$ and $H_2O$ (SC1) with the top contact 20 serving as a mask. In the later-described comparison measurements, control MFM capacitors were also grown that differed from the MFM capacitor 12 only by replacing the HZCO layer with an HZO layer of the same thickness.

FIG. 3 is a cross-sectional view of an exemplary MFIS structure 22 that includes an HZCO layer 24 according to principles of the present disclosure. As previously described, the MFIS structure 24 may be employed, for example, in a gate stack or gate structure for a FeFET device. As illustrated, the HZCO layer 24 is arranged on a substrate 26 or wafer with an interfacial insulating layer 28 therebetween. A top electrode 30 and a top contact 32 are arranged on the HZCO layer 24. The top contact 32 is provided on the top electrode 30 in an arrangement for receiving external electrical connections for the MFIS structure 22. For the purposes of later-described comparison measurements, multiple ones of the MFIS structure 22 were fabricated. For each MFIS structure 22, the substrate 26 comprises a p-type silicon substrate or wafer that is first subjected to a standard cleaning process, such as RCA cleaning, followed by a hydrofluoric acid (HF) dip to remove any native oxide and then formation of the insulating layer 28. The insulating layer 28 was formed of silicon dioxide ($SiO_2$) with a thickness of about 1.7 nm, although other insulating materials such as silicon oxynitride (SiON) may also be used. The HZCO layer 24 was deposited according to FIG. 1A to provide a film thickness of about 7 nm. The top electrode of TiN was formed by a sputtering process to provide a thickness of about 10 nm, followed by a post-metal RTA performed at 600° C. The top contact 32 may comprise a Pt or a titanium-platinum material that is then deposited by electron-beam evaporation and patterned by photolithography. The underlying top electrode 30 was then selectively wet etched by a solution of SC1 with the top contact 32 serving as a mask. In the later-described comparison measurements, control MFIS structures were also grown that differed from the MFIS structure 22 only by replacing the HZCO layer with an HZO layer of the same thickness.

Figure 4A:
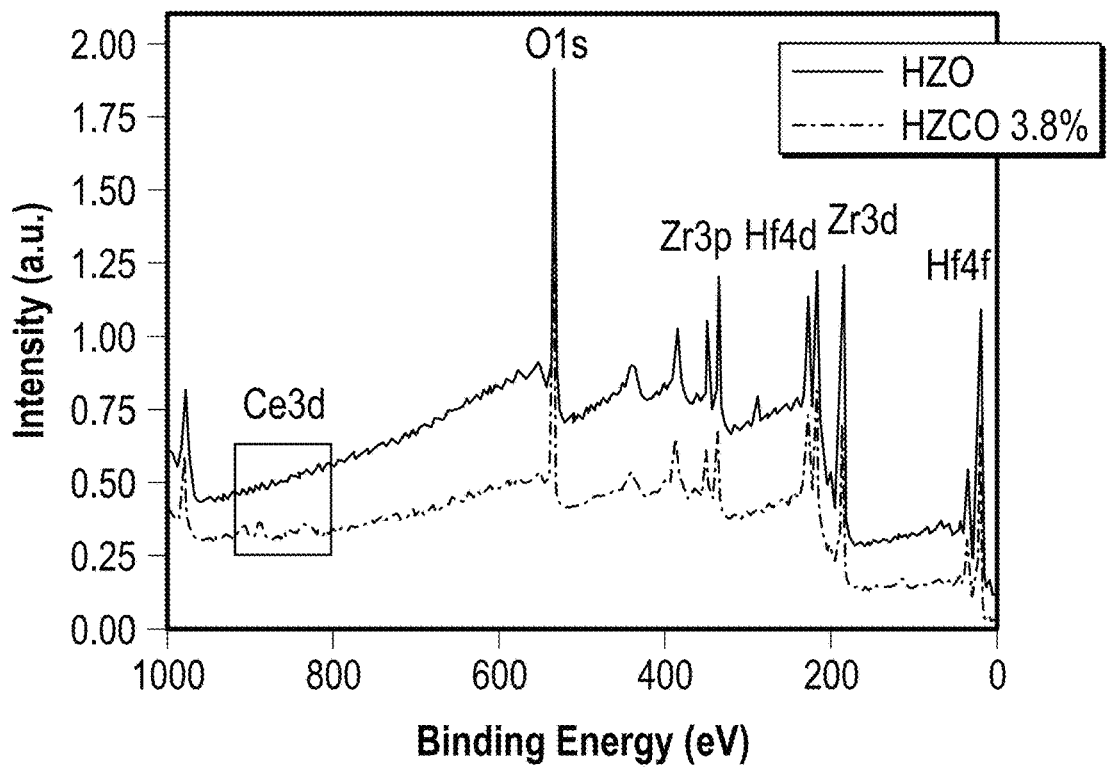
FIGS. 4A and 4B are plots representing x-ray photoelectron spectroscopy (XPS) comparing HZO layers of MFM structures with cerium doping and without cerium doping.
Figure 4B:
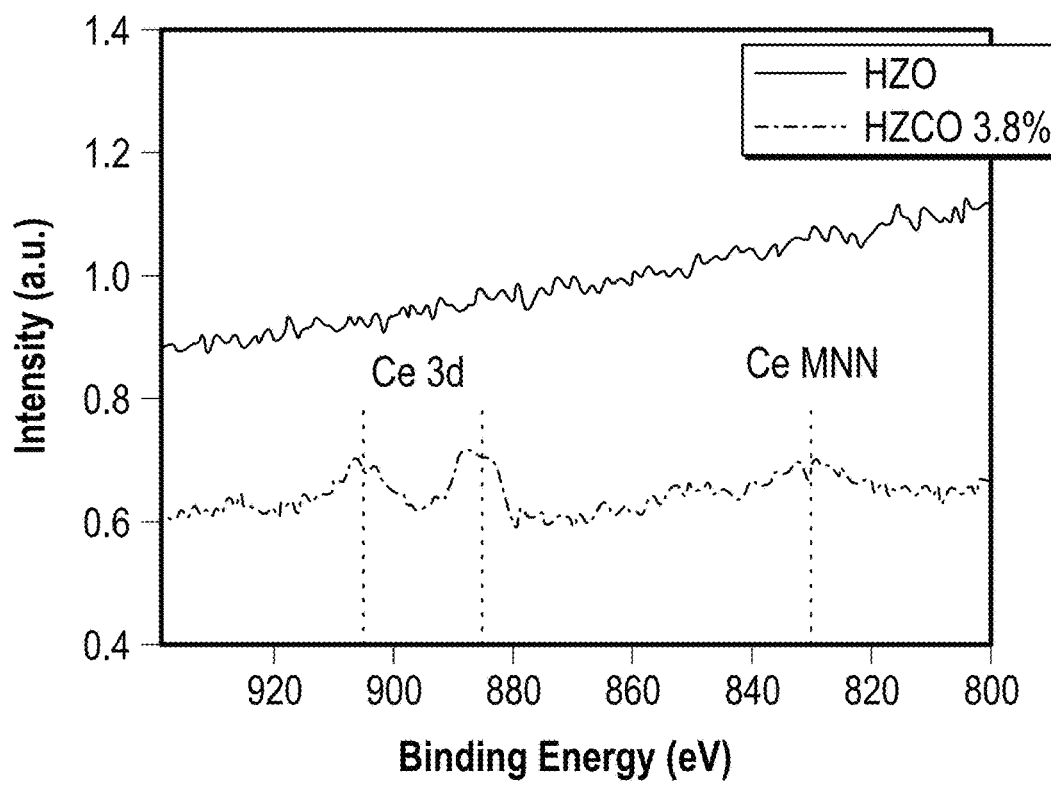

FIGS. 4A and 4B are plots representing x-ray photoelectron spectroscopy (XPS) comparing HZO layers of MFM structures with and without cerium doping. The MFM structures are similar to the MFM structure 10 of FIG. 2, with and without cerium doping for the ferroelectric layer 14 in FIG. 2. FIG. 4A illustrates XPS data showing various peaks while FIG. 4B is taken from a portion of FIG. 4A as indicated by the superimposed box of FIG. 4A to better show just the cerium peaks in the XPS data. For characterization purposes, a first MFM structure was fabricated with cerium doping according to the arrangement of the MFM capacitor 12 of FIG. 2. This first MFM structure was fabricated with about 3.8% cerium doping (e.g., $CeO_2$) and is accordingly labeled in FIGS. 4A and 4B as HZCO 3.8%. The 3.8% cerium doping was calculated as a Ce cation fraction of Ce/(Hf+Zr+Ce) as determined by XPS data and Rutherford backscattering spectrometry (RBS) measurements. A second MFM structure was fabricated in an identical manner, but without cerium doping to serve as a control. The second MFM structure is labeled in FIGS. 4A and 4B as HZO. As illustrated, the XPS spectra for the HZCO 3.8% film exhibits a characteristic Ce 3d peak which is absent in the HZO film without cerium doping. In this regard, the XPS data of FIGS. 4A and 4B confirms effective $CeO_2$ doping of the bulk of the HZCO film by the ALD deposition process as described above for FIGS. 1A and 1B.

Figure 5A:
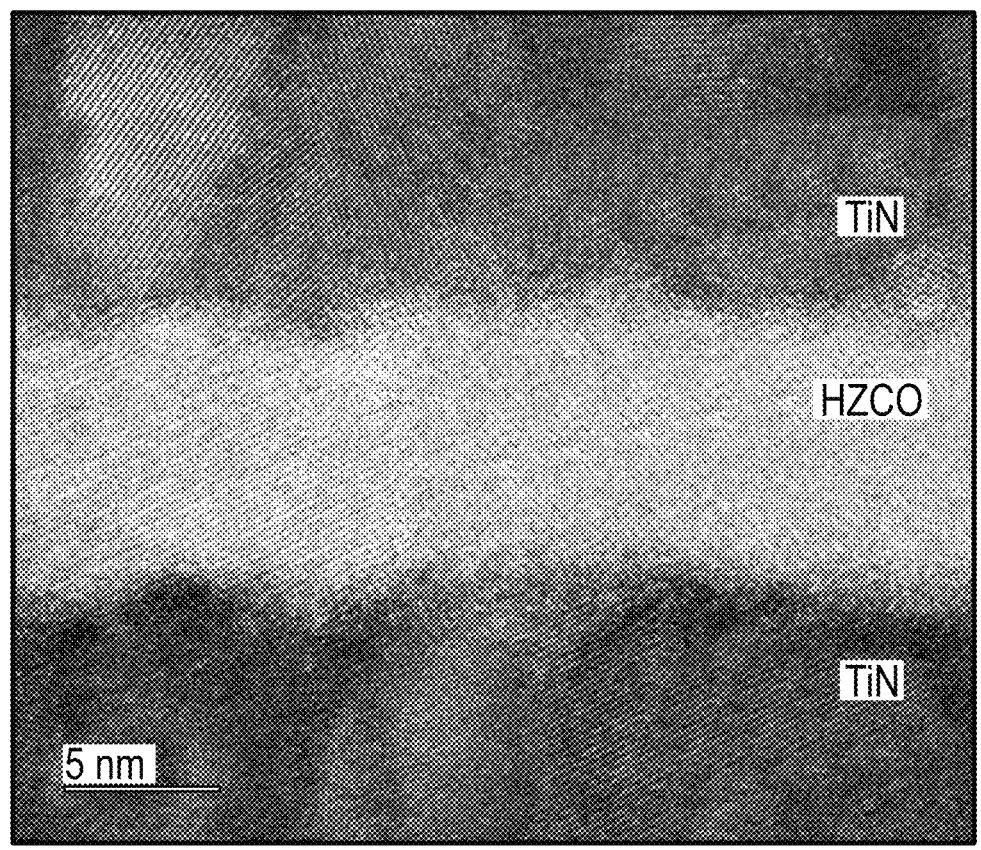
FIG. 5A is a cross-sectional scanning transmission electron microscope (STEM) image taken with low angle annular dark field (LAADF) imaging mode for a HZCO film in a MFM structure that is arranged in a similar manner to the MFM structures with cerium doping of FIGS. 2, 4A and 4B.
Figure 5D:
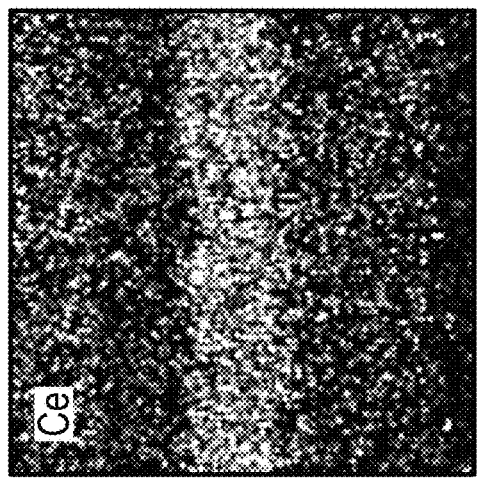
FIGS. 5B to 5D are elemental mapping images of the MFM structure of FIG. 5A using energy dispersive x-ray spectroscopy (EDS) to respectively reveal uniform detection of hafnium (Hf), zirconium (Zr), and cerium (Ce) across the HZCO film without evidence of local cerium dioxide ($CeO_2$) segregation.
Figure 5G:
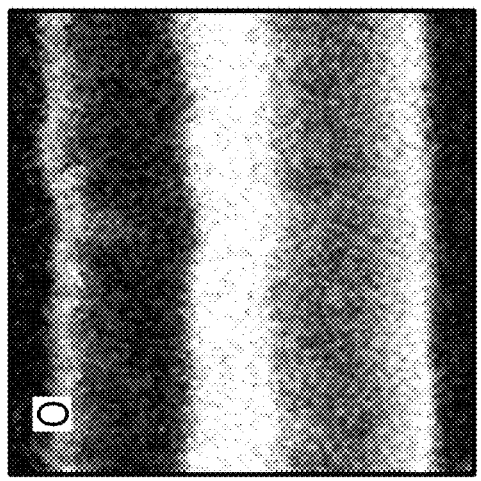
FIGS. 5E to 5G are elemental mapping images using EDS for detection of titanium (Ti), nitrogen (N), and oxygen (O) in the MFM structure of FIG. 5A.
Figure 5C:
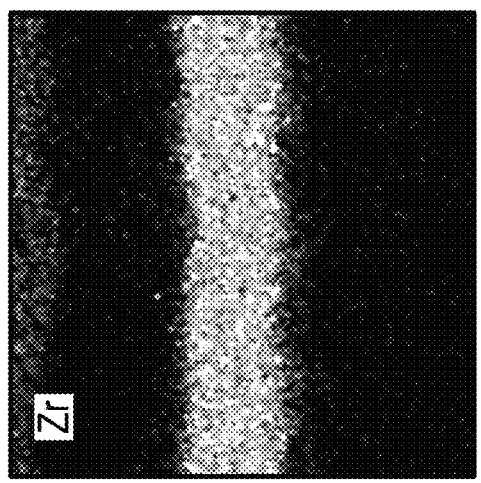
Figure 5F:
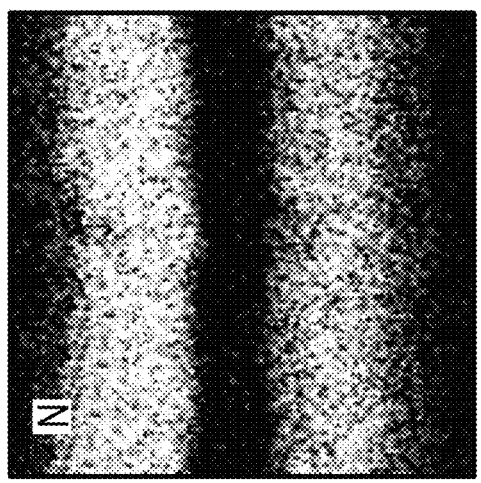
Figure 5B:
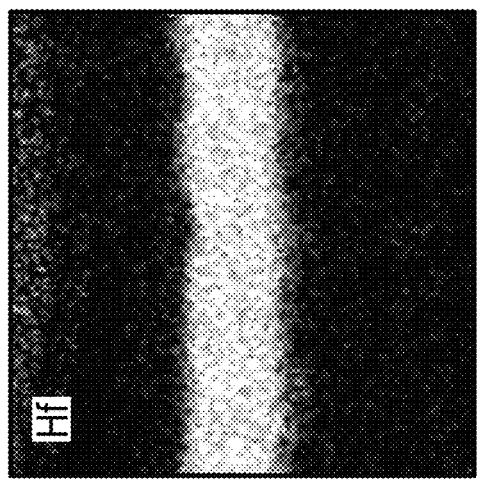
Figure 5E:
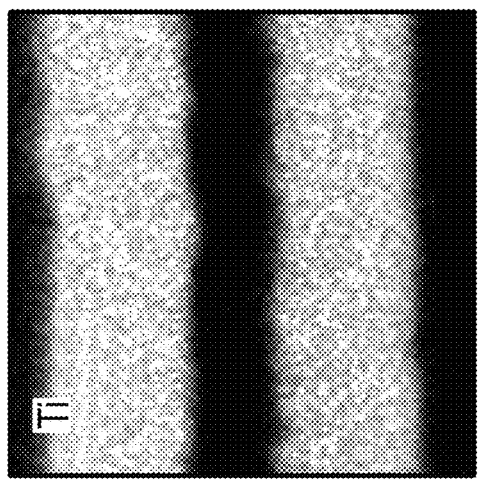
Figure 5H:
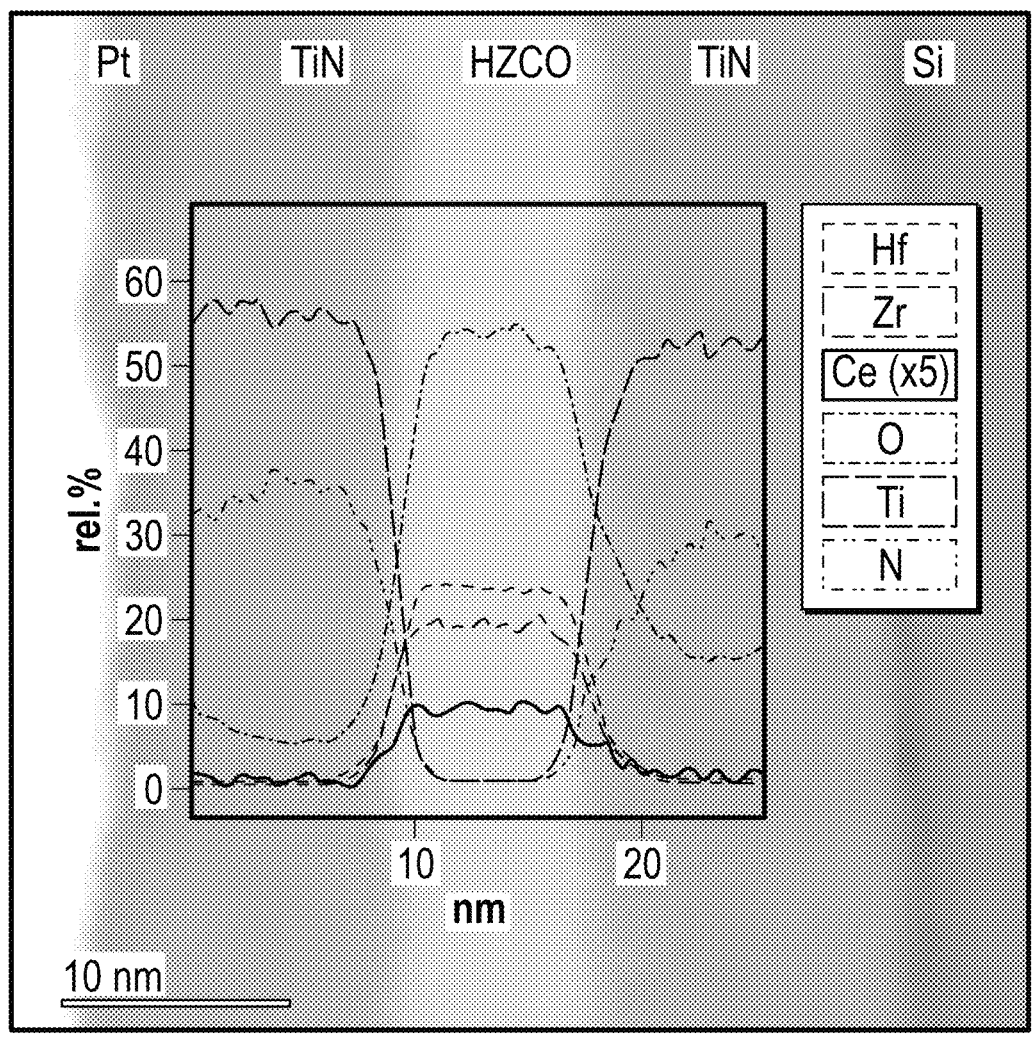
FIG. 5H is an EDS elemental profile for the MFM structure of FIG. 5A superimposed over a TEM image of the MFM structure of FIG. 5A.

FIG. 5A is a cross-sectional scanning transmission electron microscope (STEM) image taken with low angle annular dark field (LAADF) imaging mode for a HZCO 3.8% film in a MFM structure that is arranged in a similar manner to the MFM structures with cerium doping of FIGS. 2, 4A and 4B. In the image, the top and bottom electrodes of the MFM structure are labeled TiN, with the HZCO film arranged therebetween. The TEM image demonstrates crystalline grains across the HZCO 3.8% film, supporting full crystallization of HZCO films after RTA during fabrication of the MFM structure. Additionally, the STEM image of FIG. 5A suggests a substantially uniform thickness of the thin film of HZCO 3.8%, such as 9 nm±3 nm. FIGS. 5B to 5D are elemental mapping images of the MFM structure of FIG. 5A using energy dispersive x-ray spectroscopy (EDS) to respectively reveal uniform detection of Hf (FIG. 5B), Zr (FIG. 5C), and Ce (FIG. 5D) across the HZCO 3.8% film without evidence of local $CeO_2$ segregation. FIGS. 5E to 5G are elemental mapping images using EDS for detection of Ti (FIG. 5E), N (FIG. 5F), and O (FIG. 5G) in the MFM structure of FIG. 5A. FIG. 5H is an EDS elemental profile for the MFM structure superimposed over a TEM image of the MFM structure. As illustrated, the Ce doping is substantially uniform across the about 9 nm thickness of the HZCO film.

FIG. 6. is a plot depicting grazing incident x-ray diffraction (Gi-XRD) characterization of HZO films with and without cerium doping and crystalized at 400° C. In FIG. 6, a control film of HZO without cerium doping is compared with three HZCO films with respective Ce doping percentages of 2.0%, 3.8%, and 5.6%. Both the HZO film and the HZCO films were provided with a thickness of 9 nm in a similar manner to the MFM structures described above. HZO films are believed to have multiple phases coexisting together after annealing and only the polar orthorhombic (O—) phase is responsible for the ferroelectric properties of these films. As illustrated in FIG. 6, the non-polar monoclinic (M) phase peak intensity is reduced with increasing $CeO_2$ doping in these films, while the peak associated with the (111) O-phase is maintained. This (111) O-phase is likely responsible for providing ferroelectric properties in the HZCO films. In this manner, HZCO films according to the present disclosure are ferroelectric over a certain cerium doping ranges, including the range of 2.0% to 5.6% as characterized.

FIG. 7A depicts polarization-voltage (P-V) hysteresis of HZO films with and without cerium doping in MFM capacitor structures and annealed at 400° C. in a nitrogen ($N_2$) ambient. In a similar manner to FIG. 6, a control film of HZO without cerium doping is compared with three HZCO films with respective Ce doping percentages of 2.0%, 3.8%, and 5.6%, all with film thicknesses of about 9 nm. As shown, with increasing Ce doping concentration, remnant polarization decreases and the coercive field increases. FIG. 7B is a plot representing endurance of the HZO and HZCO films in the MFM structures of FIG. 7A under various cycling conditions. The polarization during cycling is read by positive-up-negative-down (PUND) measurements with the same waveform as the cycling pulses of ±3 V at 500 nanoseconds (ns), or pulse width of 500 ns, and is provided as a switchable polarization $P_{SW}$ in micro-coulombs per square centimeter ($\mu C/cm^2$). As illustrated, the HZO capacitor structure fails after $10^7$ switching cycles due to hard dielectric breakdown. However, with increased $CeO_2$ doping, the maximum number of switching cycles increases through $10^8$ and above switching cycles. Notably, the 3.8% and 5.6% HZCO capacitor structures remain switchable to $10^{10}$ cycles without breakdown, which is at least three orders of magnitude higher than identically processed undoped HZO MFM capacitor structures. The HZCO 3.8% structure, for example, remains switchable at $10^8$ through $10^{10}$ cycles with $P_{SW}$ values in a range from 5 $\mu C/cm^2$ to 50 $\mu C/cm^2$, or 17 $\mu C/cm^2$ to 40 $\mu C/cm^2$. In this regard, the HZCO structure may remain switchable after $10^{10}$ cycles of up to ±3 V (e.g., from greater than 0 V to at least ±3 V) with a pulse width of up to 500 ns (e.g., from 10 ns to 500 ns). FIG. 7C is a plot representing endurance of the HZCO 3.8% films with shorter cycling pulses at various voltages. In FIG. 7C, the cycling pulses, or pulse widths, are 100 ns with voltages ranging from 2.5 V to 4 V. When cycled with the shorter pulses at 3 V and 2.5 V, the HZCO 3.8% structure remains switchable until $10^{11}$ cycles without breakdown. Additionally, the HZCO 3.8% structure stressed by ±3 V at 100 ns pulses may remain switchable after $10^{11}$ cycles with $P_{SW}$>17 $\mu C/cm^2$. In this regard, the HZCO structure may remain switchable after $10^{11}$ cycles of up to ±3 V (e.g., from greater than 0 V to at least ±3 V) with a pulse width of up to 100 ns (e.g., from 10 ns to 100 ns).

FIG. 8A is a plot representing switchable polarization after $10^5$ cycles by cerium doping percentage for the data provided for the MFM structures of FIG. 7B. FIG. 8B is a plot representing endurance in cycle number versus cerium doping percentage for the data provided for the MFM structures of FIG. 7B. As illustrated, a target operating window for cerium doping percentage that is between about 3% and at least 6%, or above 3.8% based on the specific data points, may provide high cycling endurance while $P_{SW}$ can be modulated in a range from 10 $\mu C/cm^2$ to 28 $\mu C/cm^2$ based on cerium doping levels. With reference back to FIG. 7B, the data points for HZCO 3.8% and HZCO 5.6% MFM structures in FIG. 8B do not represent hard failures, but rather MFM structures that maintain switchable polarization after $10^{10}$ cycles.

FIG. 9 is a plot representing the effect of cerium doping in HZCO films on leakage current. Leakage current densities are plotted for MFM structures with a control film of HZO without cerium doping and three HZCO films with respective Ce doping percentages of 2.0%, 3.8%, and 5.6%. The leakage current measurements were collected on the MFM structures before cycling and indicate higher leakage conduction induced by cerium doping. As shown, the leakage current densities measured for HZCO capacitors are generally higher than that of HZO. Additionally, the leakage current density generally increases with increasing $CeO_2$ dopant concentration. In this regard, a higher conductivity of the HZCO films may be correlated with the improved endurance properties, perhaps because local Joule heating is less likely to lead to break down processes.

FIG. 10A is a cross-sectional STEM image taken with LAADF imaging mode for an MFIS structure arranged in a similar manner to the MFIS structure 22 of FIG. 3 with an HZCO 3.8% film. The MFIS structure was fabricated with a 8-9 nm thick HZCO film according to the embodiments of FIG. 1A. The HZCO film was deposited on a silicon substrate with an interfacial layer of about 1.7 nm thick $SiO_2$ for the insulating material. A top electrode of TiN and a top contact of Pt were also formed as described for the MFIS structure 22 of FIG. 3. As with the TEM image of FIG. 5, the STEM image of FIG. 10A demonstrates crystalline grains across the HZCO film. In this manner, full crystallization of HZCO films with generally uniform thickness were realized for the MFIS structure after 30 seconds of RTA at temperatures of about 600° C. As previously described, the MFIS structure of the image of FIG. 10A may be employed as part of a gate stack or gate structure in a FeFET structure.

FIG. 10B is a plot representing endurance of HZO and HZCO films in MFIS structures under various cycling conditions. MFIS structures including 7 nm thick HZCO films with 3.8% cerium doping were arranged with the structure as illustrated in FIG. 3 and similar to the STEM image of FIG. 10A. Control data was provided by MFIS structures with the same arrangement, but without cerium doping. The polarization during cycling is read by positive-up-negative-down (PUND) measurements with the same waveform as the cycling pulses of ±4 V at 500 ns and is provided as a switchable polarization $P_{SW}$ in $\mu C/cm^2$. As illustrated, the MFIS structure with HZCO 3.8% remains switchable at up to $10^{10}$ cycles. In this regard, the MFIS structure with HZCO 3.8% demonstrates at least $10^5$ times higher endurance than the identically processed MFIS with HZO.

As disclosed herein, cerium doping, such as $CeO_2$ doping, in ferroelectric films of HZO to form HZCO films dramatically increases endurance to at least $10^{10}$ cycles for MFM capacitors. Additionally, polarization of such films may be modulated based on the amount or mol % of $CeO_2$ added to HZO films. While not wishing to be bound by theory, a potential mechanism responsible for the observed increase in voltage cycling endurance resulting from $CeO_2$ doping of HZO relates to increases in leakage current density with increasing $CeO_2$ dopant concentration. In this manner, a higher conductivity of the HZCO films may be correlated with improved endurance properties, perhaps because local Joule heating is less likely to lead to break down processes. Electronic conduction mediated via in-gap electronic states, for example, in contrast to charge injection into itinerant conduction band states, has a lower chance of local Joule heating, and thus suppresses hard breakdown. The ability to modulate the value of $P_{SW}$ by $CeO_2$ doping may be beneficial for device applications, such as MFIS structures. In such structures, typical bound charges at interfaces due to the spontaneous polarization can cause excessively large internal fields across the thin insulating layer interposed between the ferroelectric layers and the semiconductor, thereby providing poor endurance properties. As disclosed herein, modulation of $P_{SW}$ by cerium doping may mitigate such large internal fields. In this manner, the ability to reproducibly modulate the magnitude of $P_{SW}$ to lower values in ferroelectric structures, while maintaining $P_{SW}$ values large enough to enable device operation, is provided.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A device comprising:
    a substrate; and
    a ferroelectric layer of $Hf_xZr_{1-x}O_2$ ($0 \le x < 1$) on the substrate, wherein the layer of $Hf_xZr_{1-x}O_2$ is doped with a cerium dopant, and wherein the cerium dopant comprises $CeO_2$ such that the ferroelectric layer of $Hf_xZr_{1-x}O_2$ is a $CeO_2$-doped $Hf_xZr_{1-x}O_2$ layer.

2. The device of claim 1, wherein a cation concentration ratio of cerium to cerium and hafnium and zirconium (Ce/(Ce+Hf+Zr)) in the $CeO_2$-doped $Hf_xZr_{1-x}O_2$ layer is in a range from 1% to 10%.

3. The device of claim 1, wherein a cation concentration ratio of cerium to cerium and hafnium and zirconium (Ce/(Ce+Hf+Zr)) in the $CeO_2$-doped $Hf_xZr_{1-x}O_2$ layer is in a range from 2% to 5.6%.

4. The device of claim 1, wherein a thickness of the $CeO_2$-doped $Hf_xZr_{1-x}O_2$ layer is in a range from 1 nm to 50 nm.

5. The device of claim 1, wherein the $CeO_2$-doped $Hf_xZr_{1-x}O_2$ layer is arranged between a first metal layer and a second metal layer to form a metal-ferroelectric-metal (MFM) capacitor structure.

6. The device of claim 5, wherein the $CeO_2$-doped $Hf_xZr_{1-x}O_2$ layer in the MFM capacitor structure is configured to be switchable after $10^{10}$ cycles of up to ±3 V with a pulse width of up to 500 ns.

7. The device of claim 6, wherein the $CeO_2$-doped $Hf_xZr_{1-x}O_2$ layer in the MFM capacitor structure is configured to be switchable after $10^{11}$ cycles of up to ±3 V with a pulse width of up to 100 ns.

8. The device of claim 5, wherein a switchable polarization ($P_{SW}$) of the $CeO_2$-doped $Hf_xZr_{1-x}O_2$ layer is in a range from 5 $\mu C/cm^2$ to 50 $\mu C/cm^2$ after the $10^8$ cycles.

9. The device of claim 1, wherein the $CeO_2$-doped $Hf_xZr_{1-x}O_2$ layer is arranged as a portion of a gate structure in a ferroelectric field-effect transistor (FeFET) device.

10. The device of claim 9, wherein the gate structure forms a metal-ferroelectric-insulator-semiconductor structure.

11. A method comprising:
    providing a substrate; and
    depositing a ferroelectric layer of $Hf_xZr_{1-x}O_2$ ($0 \le x < 1$) on the substrate, wherein the ferroelectric layer of $Hf_xZr_{1-x}O_2$ is doped with a cerium dopant, and wherein the cerium dopant comprises $CeO_2$ such that the ferroelectric layer of $Hf_xZr_{1-x}O_2$ is a $CeO_2$-doped $Hf_xZr_{1-x}O_2$ layer.

12. The method of claim 11, wherein the ferroelectric layer of $Hf_xZr_{1-x}O_2$ that is doped with a cerium dopant is deposited by at least one of sputtering, molecular-beam epitaxy (MBE), electron-beam evaporation, electron-beam physical vapor deposition (PVD), sputtering PVD, chemical vapor deposition (CVD), pulsed laser deposition (PLD), and chemical solution deposition (CSD).

13. The method of claim 11, wherein the $CeO_2$-doped $Hf_xZr_{1-x}O_2$ layer is deposited by atomic layer deposition where precursors of the $CeO_2$-doped $Hf_xZr_{1-x}O_2$ layer are sequentially formed on the substrate.

14. The method of claim 11, wherein a cation concentration ratio of cerium to cerium and hafnium and zirconium (Ce/(Ce+Hf+Zr)) in the $CeO_2$-doped $Hf_xZr_{1-x}O_2$ layer is in a range from 1% to 10%.

15. The method of claim 13, wherein the precursors of the $CeO_2$-doped $Hf_xZr_{1-x}O_2$ layer are sequentially formed on the substrate in the presence of an oxygen plasma.

16. The method of claim 13, wherein the precursors of the $CeO_2$-doped $Hf_xZr_{1-x}O_2$ layer comprise hafnium precursors, zirconium precursors, and cerium precursors, and the atomic layer deposition comprises a plurality of super cycles such that each super cycle of the plurality of super cycles comprises:
    at least one pulse of the hafnium precursor;
    at least one pulse of the zirconium precursor; and
    a plurality of pulses of the cerium precursor.

* * * * *

UNITED STATES PATENT AND TRADEMARK OFFICE
CERTIFICATE OF CORRECTION

| | | |
|---|---|---|
| PATENT NO. | : 12,166,098 B2 | Page 1 of 1 |
| APPLICATION NO. | : 17/533336 | |
| DATED | : December 10, 2024 | |
| INVENTOR(S) | : Paul C. McIntyre et al. | |

It is certified that error appears in the above-identified patent and that said Letters Patent is hereby corrected as shown below:

In the Specification

In Column 6, Line 53, replace "pulse of Hf, $Zr_{1-x}$, and Ce precursors" with --pulse of Hf, Zr, and Ce precursors--.

In Column 8, Line 11, replace "top electrode" with --top electrode 30--.

Signed and Sealed this
Eleventh Day of February, 2025

Coke Morgan Stewart
*Acting Director of the United States Patent and Trademark Office*